(12) United States Patent
Weis et al.

(10) Patent No.: US 11,996,478 B2
(45) Date of Patent: May 28, 2024

(54) TRANSISTOR DEVICE

(71) Applicant: Infineon Technologies Dresden GmbH & Co. KG, Dresden (DE)

(72) Inventors: Rolf Weis, Dresden (DE); Ahmed Mahmoud, Freising (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 239 days.

(21) Appl. No.: 17/553,059

(22) Filed: Dec. 16, 2021

(65) Prior Publication Data

US 2022/0199827 A1 Jun. 23, 2022

(30) Foreign Application Priority Data

Dec. 18, 2020 (EP) ..................................... 20215783

(51) Int. Cl.
*H01L 29/78* (2006.01)
*H01L 29/06* (2006.01)
*H01L 29/10* (2006.01)

(52) U.S. Cl.
CPC ...... *H01L 29/7816* (2013.01); *H01L 29/0653* (2013.01); *H01L 29/1037* (2013.01); *H01L 29/1045* (2013.01)

(58) Field of Classification Search
CPC . H01L 29/7816; H01L 29/7835; H01L 29/78; H01L 29/66681
See application file for complete search history.

(56) References Cited

U.S. PATENT DOCUMENTS

| 8,686,505 | B2 | 4/2014 | Strasser et al. |
| 9,214,548 | B1 | 12/2015 | Kim et al. |
| 2011/0248341 | A1 | 10/2011 | Ring |
| 2012/0261753 | A1 | 10/2012 | Hopper et al. |
| 2016/0336410 | A1 | 11/2016 | Hsiao et al. |
| 2020/0258987 | A1* | 8/2020 | Chuang ................. H01L 29/402 |

FOREIGN PATENT DOCUMENTS

WO 2014174741 A1 10/2014

* cited by examiner

*Primary Examiner* — Mohammed R Alam
(74) *Attorney, Agent, or Firm* — Murphy, Bilak & Homiller, PLLC

(57) ABSTRACT

A transistor device includes a semiconductor body having a substantially planar main surface, a source region extending to the main surface and having a first conductivity type, a body region extending to the main surface and having a second conductivity type, a drain region extending to the main surface and having the first conductivity type, a drift region having the first conductivity type, and a gate electrode arranged on the main surface laterally between the source and drain regions and electrically insulated from the semiconductor body by an insulation structure. The insulation structure includes a gate dielectric arranged on the main surface and a shallow trench arranged in the drift region and filled with electrically insulating material. The shallow trench has at least partly a wedge shape and the electrically insulating material has an upper surface that is substantially planar and extends substantially parallel to the main surface.

22 Claims, 7 Drawing Sheets

TRANSISTOR DEVICE

BACKGROUND

To date, transistors used in power electronic applications have typically been fabricated with silicon (Si) semiconductor materials. Common transistor devices for power applications include Si CoolMOS®, Si OptiMOS®, Si Power MOSFETs, and Si Insulated Gate Bipolar Transistors (IGBTs). Power devices capable of switching large currents and/or operating at higher voltages, which have a low on-state resistance, RDSon, and a high breakdown voltage are desirable.

Lateral field-effect transistors, for example LDMOS (Lateral Diffused Metal Oxide Semiconductor) transistors, may be manufactured using a double diffusion process and with drain, drift and source regions extending to a main surface. Commonly, a field plate is arranged on a field oxide extending along the drift region next to the main surface in order to lower the RDSon for a given breakdown voltage. The field oxide may be formed using a LOCOS process (LOCal Oxidation of Silicon). The breakdown voltage of the semiconductor devices with such a field plate structure is influenced by the dielectric properties and the vertical thickness of the field oxide. However, thicker LOCOS field oxides may increase the on-state resistance Ron.

U.S. Pat. No. 8,686,505 discloses an integrated semiconductor device having a field effect structure having insulation structure in a trench such that a field dielectric portion forms a second horizontal interface and a third horizontal interface with the drift region. The field dielectric portion may be suitably thickened for this field effect structure so that the breakdown voltage is increased for the field effect structure having the highest rated blocking capability, but without significantly reducing the on-resistance. Thus, an integrated semiconductor device with structures of different rated blocking capability can be provided.

Accordingly, there is a need to improve field compensation structures in lateral transistor devices.

SUMMARY

In an embodiment, a transistor device is provided that comprises a semiconductor body having a substantially planar main surface, a source region extending to the main surface and having a first conductivity type, a body region extending to the main surface and having a second conductivity type, the body region forming an interface with the source region, a drain region extending to the main surface and having the first conductivity type, a drift region having the first conductivity type and extending between the body region and the drain region and a gate electrode. The gate electrode is arranged on the main surface laterally between the source region and the drain region and is electrically insulated from the semiconductor body by an insulation structure. The insulation structure comprises a gate dielectric arranged on the main surface, and a shallow trench arranged in the drift region and filled with electrically insulating material. The shallow trench has at least partly a wedge shape. The electrically insulating material has an upper surface that is substantially planar and that extends substantially parallel to the main surface of the semiconductor body.

In some embodiments, the shallow trench has a base that extends into the semiconductor body at an inclined angle α to the main surface and in a direction from the gate dielectric to the drain region.

In some embodiments, the inclined angle α lies within the range of 0.8° to 8.8°.

In some embodiments, the base extends into the semiconductor body at the inclined angle α to the main surface in a first portion and extends substantially parallel to the main surface in a second portion.

In some embodiments, the base of the shallow trench extends to a side wall that extends substantially perpendicularly to the main surface.

In some embodiments, the drain region is in contact with the insulating material in the shallow trench and forms the side wall of the shallow trench.

In some embodiments, the transistor device further comprises a doped layer having the first conductivity type formed in the semiconductor body. The doped layer forms the base of the shallow trench and is electrically coupled to the drain region.

In some embodiments, the transistor device further comprises a field plate that covers at least 50% of the length of the shallow trench at the main surface. The field plate may be integral with the gate electrode or separate from the gate electrode.

In some embodiments, the transistor device further comprises a field plate extension comprising one or more portions arranged between the field plate and the drain region that are spaced at a greater distance from the main surface than a distance between the field plate and the main surface.

In some embodiments, the portions of the field plate extension extend substantially parallel to the main surface and are electrically coupled to the field plate by conductive vias extending substantially perpendicularly to the main surface.

In some embodiments, the field plate extension comprises two or more portions that form a staggered field plate extension.

In some embodiments, the end of the one or more portions that faces the drain region forms an inclined angle α' to the main surface that is substantially the same as the inclined angle α formed between the base of the shallow trench and the main surface.

In some embodiments, the transistor device further comprises a superjunction structure arranged in the drift region under the shallow trench. The superjunction structure comprises one or more first elongated doped regions of the first conductivity type and one or more second elongated doped regions of the second conductivity type and each having a length that extends substantially parallel to the base of the shallow trench.

In some embodiments, the transistor device further comprises a first doped contact region having the first conductivity type and a second doped contact region having the second conductivity type. The first doped contact region is arranged on a first side of the superjunction structure and electrically coupled to the first doped regions of the superjunction structure and to the drain region. The second doped contact region is arranged on a second side of the superjunction structure, the second side opposing the first side. The second doped contact region is electrically coupled to the second doped regions and to a body contact at the main surface.

In some embodiments, the first doped contact region forms the base of the shallow trench.

In some embodiments, the first and second contact regions extend over the superjunction structure.

In some embodiments, the second doped contact region is electrically coupled to a highly doped body contact forming an interface with the source region by a doped region that extends perpendicularly to the main surface.

In some embodiments, the shallow trench comprises a first side wall formed by the drain region and the superjunction structure extends to the main surface at a position below the gate dielectric.

In some embodiments, an interface between the first elongate doped region and the second elongate doped region of the superjunction structure is arranged substantially perpendicularly to the base of the shallow trench.

In an embodiment, a transistor device is provided that comprises a semiconductor body having a main surface, a source region extending to the main surface and having a first conductivity type, a body region extending to the main surface having a second conductivity type, the body region forming an interface with the source region, a drain region extending to the main surface and having the first conductivity type, a drift region having the first conductivity type and extending between the body region and the drain region and a gate electrode arranged on the main surface laterally between the source region and the drain region and electrically insulated from the semiconductor body by an insulating structure. The insulating structure comprises a gate dielectric arranged on the main surface and a shallow trench arranged in the drift region. The transistor device further comprises a superjunction structure arranged in the drift region. The superjunction structure comprises at least one first elongated doped region of the first conductivity type and at least one second elongated doped region of the second conductivity type each having a length that extends parallel to the main surface. A first doped contact region having the first conductivity type is arranged on a first side of the superjunction structure, wherein the first doped contact region is electrically coupled to the at least one first elongated doped region of the superjunction structure and to the drain region. A second doped contact region having the second conductivity type is arranged on a second side of the superjunction structure opposing the first side, wherein the second doped contact region is electrically coupled to the at least one second elongated doped region of the superjunction structure and to a body contact at the main surface.

In some embodiments, the first doped contact region forms the base of the shallow trench.

In some embodiments, the first and second contact regions extend over the entire superjunction structure.

In some embodiments, the second doped contact region is electrically coupled to a highly doped body contact that forms an interface with the source region by a doped region that extends perpendicularly to the main surface.

In some embodiments, the shallow trench comprises a first side wall formed by the drain region.

In some embodiments, the superjunction structure extends to the main surface below the gate dielectric and forms a second side wall of the shallow trench that opposes the first side wall.

In some embodiments, the first side wall of the shallow trench extends substantially perpendicularly to the main surface.

In some embodiments, the superjunction structure extends to the main surface at an inclined angle to the main surface, wherein the inclined angle is between 45° and 89°.

In some embodiments, interfaces between the first elongate doped regions and the second elongate doped regions of the superjunction structure are arranged substantially perpendicularly to the main surface.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

Figure 1:
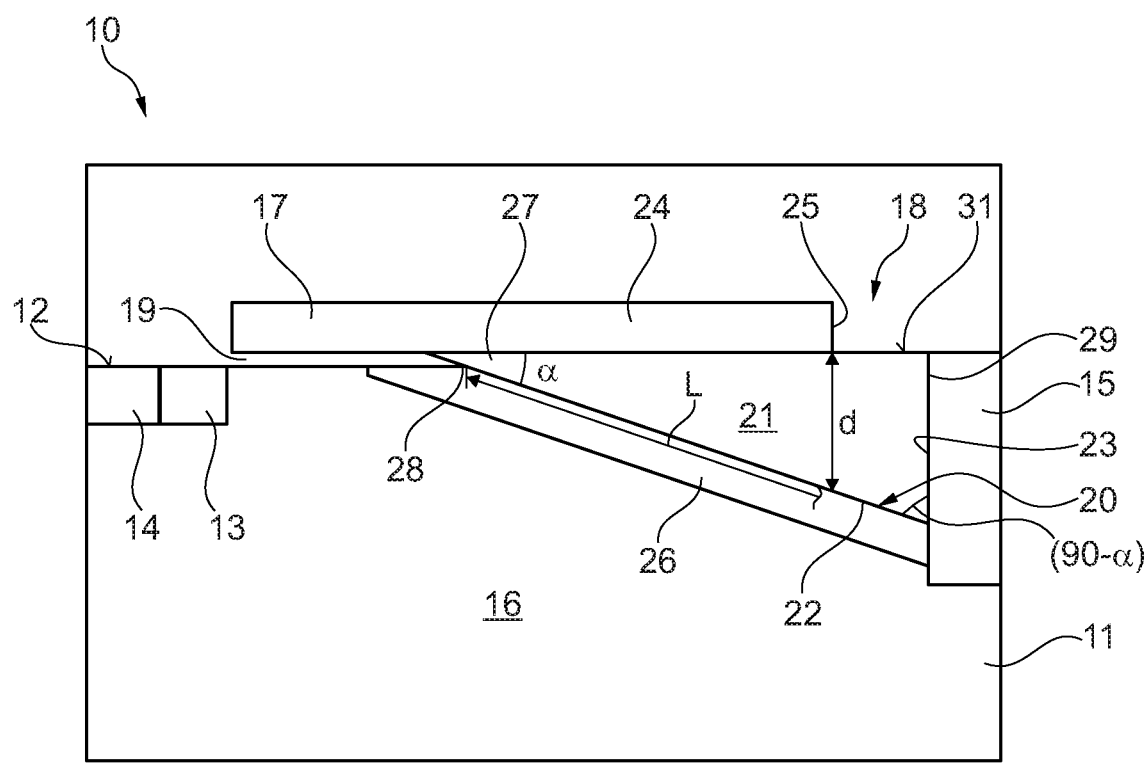
FIG. 1 illustrates a cross-sectional view of a transistor device according to an embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, various device types and/or doped semiconductor regions may be identified as being of n type or p type, but this is merely for convenience of description and not intended to be limiting, and such identification may be replaced by the more general description of being of a "first conductivity type" or a "second, opposite conductivity type" where the first type may be either n or p type and the second type then is either p or n type.

The Figures illustrate relative doping concentrations by indicating "−" or "+" next to the doping type "n" or "p". For example, "n⁻" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations.

A low on state resistance for a given area, RDSON*A, is desirable for lateral MOSFET (Metal Oxide Semiconductor Field Effect Transistor) devices for voltages above 20V. One challenge is to create a suitable structure which requires a low processing effort but which has an improved electrical performance. According to the disclosure, compensation methods, in particular a field-plate arranged close to a drift zone and/or superjunction compensation, are applied to a lateral transistor device to improve RDSON*A. In some embodiments, a tapered oxide structure for field-plate compensation or a superjunction-arrangement is provided. In some embodiments, the lateral transistor device comprises a tapered field plate structure and a superjunction structure in order to improve RDSON*A.

In some embodiments, a tapered shallow trench isolation (STI) structure is provided to implement an improved oxide geometry for a field-plate compensation. This tapered shallow trench can be optionally extended through an extension having a uniform depth for devices with a higher operating voltage. A stepped, triangle-boarded arrangement of at least two additional metal layers over the extension may also be provided.

In some embodiments, a superjunction structure is arranged below a tapered shallow STI. A continuous doped layer connected to drain is arranged above the superjunction structure and a continuous doped layer of the opposite doping type connected to source is arranged below the superjunction structure. The doped layer above the superjunction contains charge carriers that are compensated by the field plate above the STI and by the doped layer below the superjunction structure.

FIG. 1 illustrates a cross-sectional view of a lateral transistor device 10 according to an embodiment. The transistor device 10 includes a semiconductor body 11 having a planar main surface 12, a source region 13, a body region 14, 16 and a drain region 15. The source region 13 has a first conductivity type and the body region 14, 16 has a second conductivity type, which opposes the first conductivity type. The body region 14,16 forms an interface with the source region 13. The drain region 15 has the first conductivity type. The source region 13, the body region 14 and the drain region 15 extend to the main surface 12 of the semiconductor body 11. The transistor device further includes a drift region 26 formed in the semiconductor body 11 which extends between the body region 16 and the drain region 15 and which has the first conductivity type. The source region 13 and the drain region 15 are more highly doped than the drift region 16.

In some embodiments, the first conductivity type is n-type and the second conductivity type is p-type. In other alternative embodiments, the first conductivity type is p-type and the second conductivity type is n-type. The semiconductor body 11 is formed of monocrystalline or epitaxial silicon.

The transistor device 10 further includes a gate electrode 17 which is arranged on the main surface 12 laterally between the source region 13 and the drain region 15. The gate electrode 17 is electrically insulated from the semiconductor surface 12 by an insulation structure 18. The insulation structure 18 comprises a gate dielectric 19 which is arranged on the main surface 12 and a shallow trench 20 which is arranged above the drift region 26 and which is filled with electrically insulating material 21. The shallow trench 20 has at least partly a wedge shape.

Due to the wedge shape of the shallow trench 20, the shallow trench 20 has a tapered form and has a tip 27 forming an acute angle α, i.e. an angle between 0.5° and 45° with the planar main surface 12.

The trench 21 has a base 22 which extends into the semiconductor body 11 from the main surface 12 at the inclined angle α to the planar main surface 12 and in a direction from the gate dielectric 19 to the drain region 15. The shallow trench 20 therefore has a smaller depth at its gate side 28 than at its drain side 29. The electrically insulating material 21 which fills the shallow trench 20 has an upper surface 31 which extends in a plane which is substantially parallel to the plane of the planar main surface 12 of the semiconductor body 10 over the entire area of the shallow trench 20. The inclined angle α may lie within the range of 0.8° to 8.8° and, in some embodiments within a range of 4.5° to 5°.

In some embodiments, such as that illustrated in FIG. 1, the base 22 of the shallow trench extends at the inclined angle α from the main major surface 12 into the semiconductor body 11 to a sidewall 23 which extends substantially perpendicularly to the main surface 12, thus forming a wedge shape for the shallow trench 20. The angle between the base 22 and the side wall is 90°-α°. The drain region 15 may form an interface with the electrically insulating material 12 and therefore form the sidewall 23 of the shallow trench 20. Due to the wedge shape of the shallow trench 20, the shallow trench 20 has a triangular shape in cross-section.

The gate dielectric 19 is positioned between the gate electrode 17 and the main surface 12. In some embodiments, the drain sided edge 25 of the gate electrode 17 is in direct contact with the electrically insulating material 21 positioned within the shallow trench above the tip 27 of the trench 20. In these embodiments, the gate dielectric 19 is in contact with a side face of the electrically insulating material 21.

In some embodiments, such as that illustrated in FIG. 1, the gate electrode 17 has a length such that at least 50% of its length is positioned above the shallow trench 20. The region of the insulating material 21 positioned adjacent the drain region 15 remains uncovered by the field plate 24. The portion of the gate electrode 17 positioned above the shallow trench 20 provides a field plate 24 which is integral with the gate electrode 17. The gate electrode 17 and the integral field plate portion 24 are substantially planar and extend substantially parallel to the main surface 12. Due to the inclined angle α formed between the base 22 of the shallow trench 20 and the main surface 12 of the semiconductor body, an inclined angle α is formed between the base 22 and the lower surface of the gate electrode 17 and field plate 24. Due to this inclined angle, the distance between the field plate 24 and the material of the semiconductor body 11 in the drift region 16 continuously increases in a direction from the source region 13 towards the drain region 15 as the depth of the wedge-shaped shallow trench 20 and the insulating material 21 within the trench 20 increases.

In some embodiments, the depth d of the shallow trench 20 at a position under the drain side end 25 of the field plate 24 may be around 0.4 μm and the length l of the base 22 from the main surface 12 to a point vertically under the drain sided end of the field plate may be around 5 μm. The inclined angle α may be around 4.8°.

The transistor device 10 further includes a doped layer 26 having the first conductivity type which is formed in the semiconductor body 11 and which forms the base 22 of shallow trench 20. The doped layer 26 is the drift region and has the opposite doping type to the body region 16. The doped layer 26 providing the drift region extends from the main surface 12 at the inclined angle α from a position underneath the gate electrode 17 in the direction of the drain region 15. The doped layer 26 is electrically coupled to the drain region 15 and may overlap the drain region 15. The gate sided end of the doped layer 26 forms a portion of the main surface 12 of the semiconductor body 11 and is in contact with the gate dielectric 19.

Figure 2:
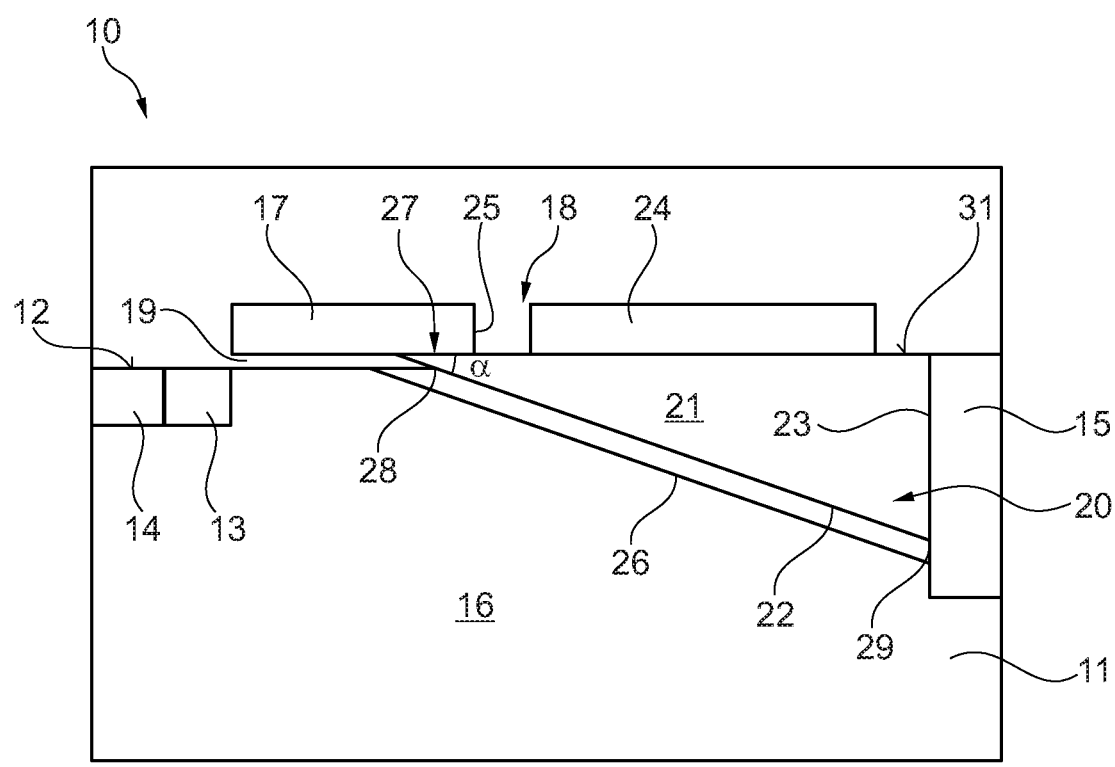
FIG. 2 illustrates a cross-sectional view of a transistor device according to an embodiment.

FIG. 2 illustrates a cross-sectional view of a lateral transistor device 30 according to an embodiment which has the insulation structure 18 illustrated in FIG. 1 but differs in that the field plate 24 is separate from the gate electrode 17. The gate electrode 17 extends from the source region 13 in the direction of the drain region 15 and has a drain sided end 25 which is positioned above the tip 27 of the wedge-shaped shallow trench 20. The drain sided end 25 of the gate electrode 17 is in direct contact with the electrically insulating material 21 positioned in the shallow trench 20. The field plate 24 is spaced apart from the gate electrode 17 and positioned between the drain sided end 25 of gate electrode 17 and the drain region 15. The field plate 24 is substantially coplanar with the gate electrode 17 and is positioned directly on and in contact with the electrically insulating material 21 positioned within the shallow trench 20. The gate electrode 17 and the field plate 24 are planar.

The spacing between the field plate 24 and the semiconductor material of the semiconductor body 11 and, therefore, also the doped layer 26 providing the drift region, increases from the gate sided end to the drain sided end of the field plate 24 due to the inclined angle α formed between the base 22 of the shallow trench 20 and the planar upper surface 31 of the insulating material 21 that is substantially parallel to the main surface 12. The depth of the insulating material 21 positioned in the shallow trench 20 therefore increases from the gate sided end to the drain sided end of the field plate 24 due to the inclined angle α formed between the base 22 of the shallow trench 20 and the planar upper surface 31 of the insulating material 21.

In embodiments in which the field plate 24 is separate from the gate electrode 17, the separate field plate 24 can be connected to the source region or source potential, the gate electrode or may be connected to an extra power supply. The region of the insulating material positioned adjacent the drain region 15 remains uncovered by the field plate 24. The separate field plate 24 may cover at least 50% but less than 90% of the upper surface of the insulating material 21 in the shallow trench 20.

Figure 3:
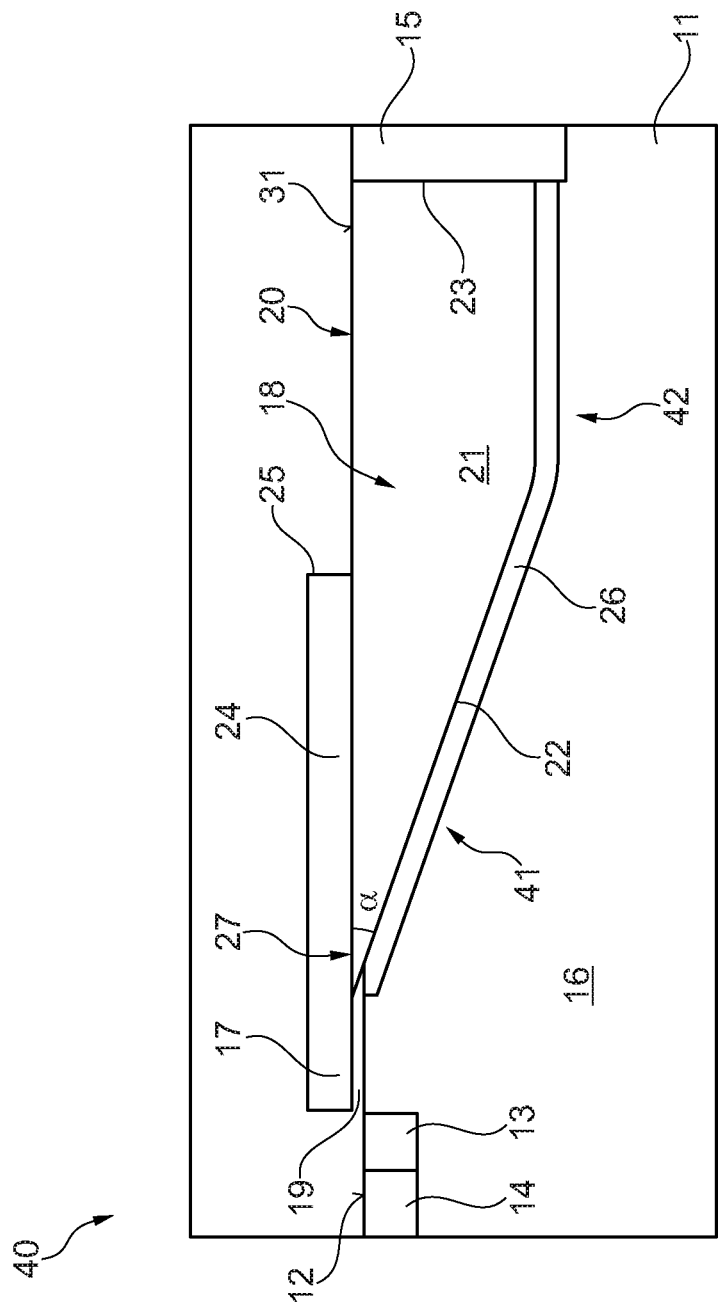
FIG. 3 illustrates a cross-sectional view of a transistor device according to an embodiment.

FIG. 3 illustrates a cross-sectional view of a lateral transistor device 40 which differs from the transistor devices 10, 30 illustrated in FIGS. 1 and 2 in the shape of the shallow trench 20. Referring to FIG. 3, in some embodiments, the tapered wedge-shaped shallow trench 20 further includes an extension which has a substantially uniform depth. The base 22 of the trench 20 extends in a first portion 41 at the inclined angle α from the main surface 12 in a direction from the gate dielectric 19 towards the drain region 15 and has a triangular shape in cross-section as in the embodiment illustrated in FIG. 1. The base 22 then extends in a second portion 42 substantially parallel to the main surface 12. The first portion 41 has a depth that increases in a direction from the gate 17 to the drain region 15, whereas the second portion 42 has a substantially uniform depth.

The gate electrode 17 may have an integral field plate 24, as illustrated in FIG. 3, or the field plate 24 may be separate from the gate electrode 17. The field plate 24 has a length such that its drain sided end 25 is positioned above the wedge-shaped first portion 41 of the shallow trench 20 and such that the second portion 42 of the shallow trench 40 remains uncovered by the field plate 24. The transistor device 40 also includes the doped layer 26 forming the drift region which forms the base 22 of the shallow trench 22 in both the first and second portions 41, 42. The doped layer 26 forming the drift region, therefore, extends from the main surface at the inclined angle α and then substantially parallel to the main surface to the drain region 15.

Figure 4:
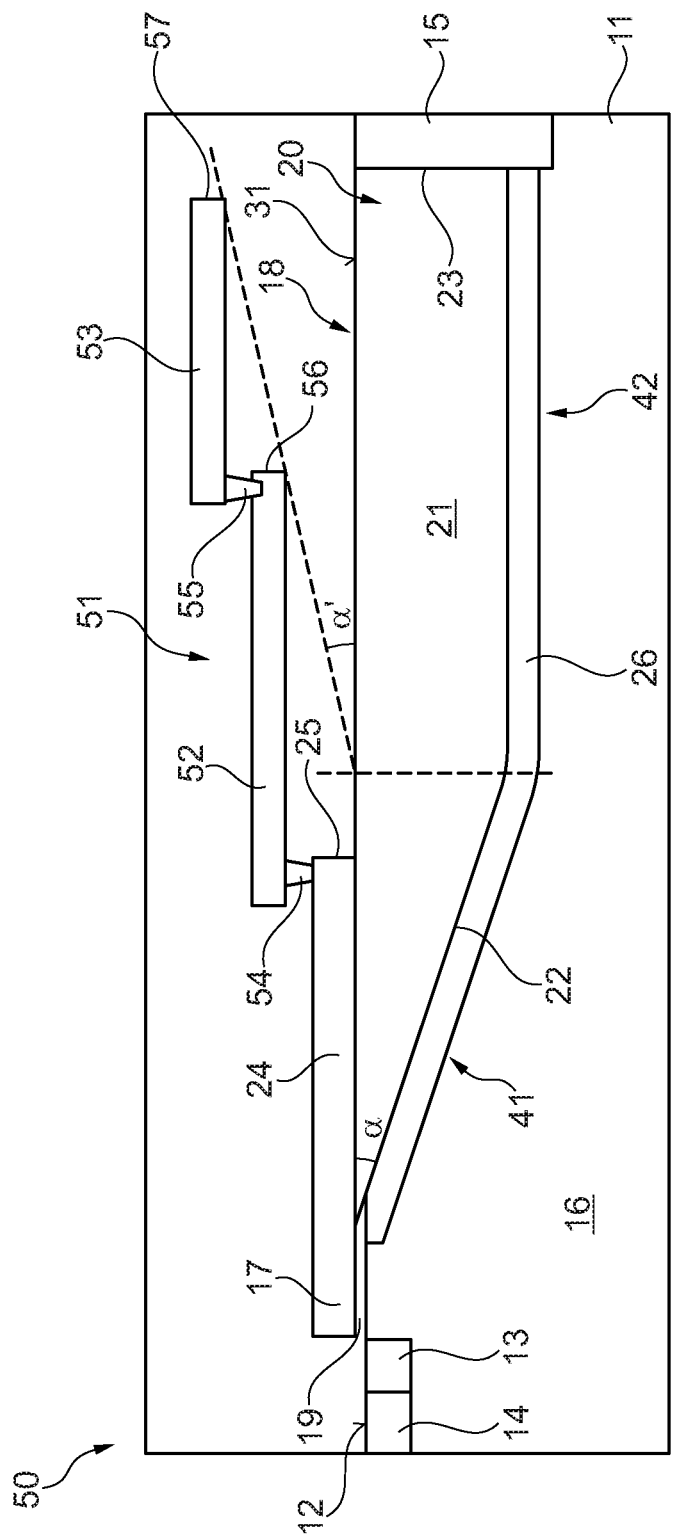
FIG. 4 illustrates a cross-sectional view of a transistor device according to an embodiment.

FIG. 4 illustrates a cross-sectional view of a lateral transistor device 50 according to an embodiment. The transistor device 50 includes a shallow trench 20 having the form illustrated in FIG. 3 and a first portion 41 which has a base 22 extending at an inclined angle α to the main surface 12. The first portion 41 extends into a second portion 42 which has a substantially uniform depth from the first portion 41 to the drain region 15 as the base 22 extends in a plane substantially parallel to the plane of the main surface 12. The gate 17 has an integral field plate 24 and is positioned between the source region 13 and the drain region 15 and has a length such that the drain sided end 25 of the field plate 24 is positioned above the first wedge-shaped portion 41 of the shallow trench 20.

In the embodiment illustrated in FIG. 4, the field plate 24 has an extension 51 which is arranged between the field plate 24 and the drain region 15. In the embodiment illustrated in FIG. 4, the field plate extension 51 includes two horizontal portions 52, 53 which are arranged at increasing distance from the main surface 12 in a direction towards the drain region 15. The first portion 52 and the second portion 53 along with the gate electrode 17 and integral field plate 24 extend substantially parallel to the main surface 12.

The lower portion 52 of the field plate extension 51 vertically overlaps with the drain sided end 25 of the field plate 24 and is electrically connected to the underlying field plate 24 by a first conductive via 54. The second portion 52 is positioned vertically above and overlaps with the drain sided end of the first portion 52 and is electrically connected with the first portion 52 by a second conductive via 55. The conductive vias 54, 55 extend substantially perpendicularly to the main surface 12. In the embodiment illustrated in FIG. 4, the field plate 24 can be considered to have a staggered field plate extension 51.

The drain sided ends 56, 57 of the two horizontal portions 52, 53 of the field plate extension 51 may form an inclined angle α' with the main surface 12. This inclined angle α' may be substantially the same as the angle α formed between the base 22 of the shallow trench 20 and the main surface 12. In this embodiment, a field reduction structure is provided below the main surface 12 and within the semiconductor body by the tapered shallow trench 20 and above the main surface 12 by the staggered field plate structure 51. These two structures are substantially symmetrically arranged about the main surface 12 and the distance between them increases in a direction from the gate dielectric 19 to the drain region 15.

In other non-illustrated embodiments, a field plate 24 that is separate from the gate electrode is provided as in the embodiment illustrated in FIG. 2. In these embodiments, the field plate 24 with its extension 51 may be electrically coupled to the source region 13 or to a separate voltage supply or to the gate electrode.

Figure 5A:
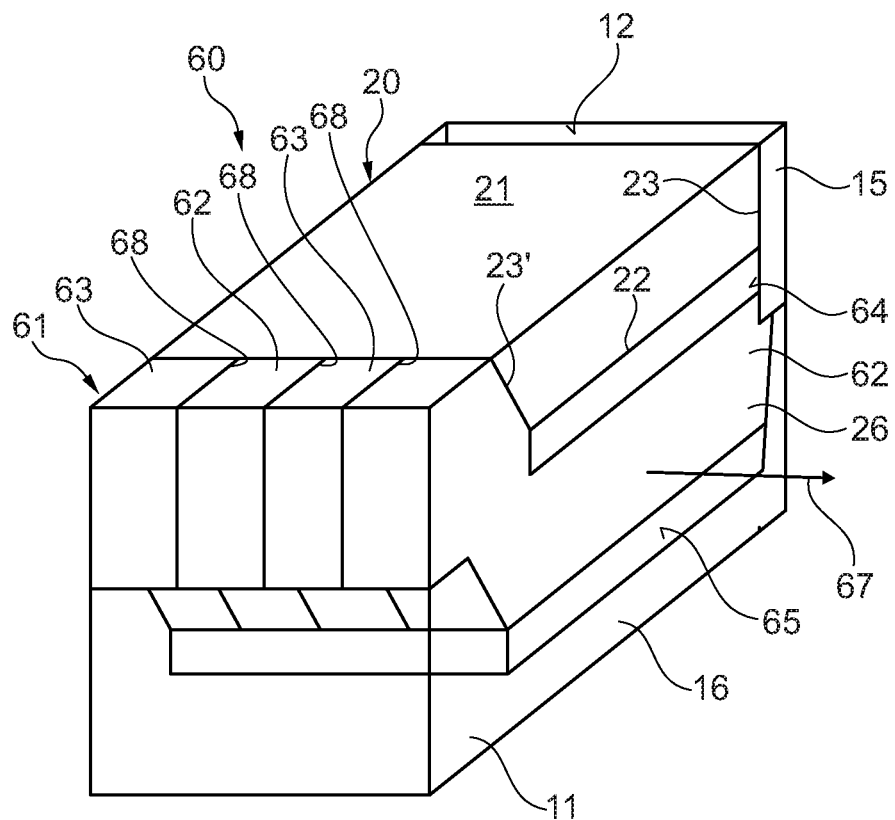
FIG. 5A illustrates a perspective view of a transistor device according to an embodiment.
Figure 5B:
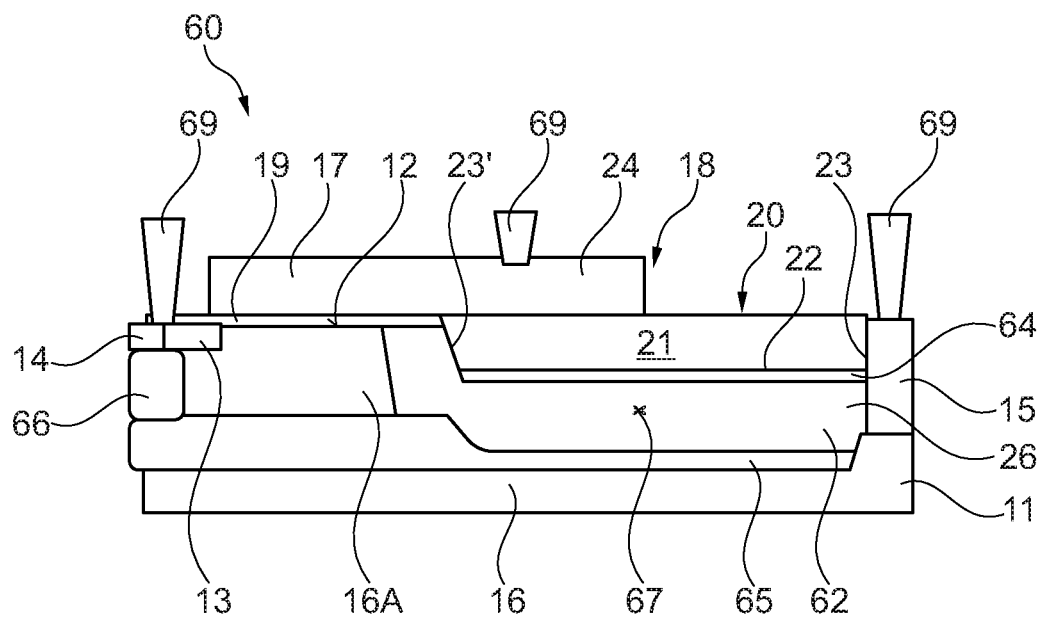
FIG. 5B illustrates a cross-sectional view of the transistor device of FIG. 5A.

FIG. 5A illustrates a perspective view and FIG. 5B a cross-sectional view of a lateral transistor device 60 according to an embodiment. The transistor device 60 includes a semiconductor body 11 having a main surface 12, a source region 13, extending to the main surface and having a first conductivity type, a body region 14, 16A, 16 extending to the main surface 12 and having a second conductivity type, the second conductivity type opposing the first conductivity type. The body regions 14, 16A, 16 form an interface with the source region 13. The transistor device 60 further includes a drain region 15 extending to the main surface 12 which has the first conductivity type and which is spaced apart from the source region 13. The transistor device 60 further comprises a drift region 64 having the first conductivity type and extending between the body region 16A and a drain region 15 and a gate electrode 17 arranged on the main surface 12 laterally between the source region 13 and the drain region 15 to from a lateral transistor device structure. The gate electrode 17 is electrically insulated from the semiconductor body 16A by a gate insulating structure 18 which comprises a gate dielectric 19 arranged on the main surface 12 and a shallow trench 20 arranged in the drift region 67.

In this embodiment, the shallow trench 20 has a depth which is substantially uniform along its length and which has side walls 23, 23' which extend substantially perpendicularly to the main surface 12. The transistor device 60 comprises a superjunction structure 61 as a field compensation structure. The superjunction structure 61 is arranged under the drift region 62 under the shallow trench 21 and extends under the entire area of the shallow trench 21 to the drain region 15 which forms the side wall 23 of the shallow trench 20.

The superjunction structure 61 comprises at least one first elongated doped region 62 of the first conductivity type and at least one second elongated doped region 63 of the second conductivity type. The first and second elongated doped regions 62, 63 are arranged in a stack having a stacking direction 67 which extends substantially parallel to the main surface 12. Each of the first and second elongated doped regions 62, 63 has a long direction having a length that extends in a direction from the source region 13 towards the drain region 15 substantially parallel to the main surface 12 and substantial perpendicularly to the stacking direction 67.

A PN junction 68 is formed between immediately adjacent first and second elongate doped regions 62, 63 which extends substantially perpendicularly to the main surface 12 and has a length extending in a direction from the source region 13 to towards the drain region 15 and substantially parallel to the main surface 12. The first elongated doped regions 62 form the drift region 26 of the transistor device 60.

The transistor device 60 further includes a first doped contact region 64 which has the first conductivity type. The first doped contact region 64 is more highly doped than the first elongated doped region 62. The doping concentration of the first elongated doped region 62 may be the same or smaller than the doping concentration of the contact region 64. The first doped contact region 64 is arranged on a first side of the superjunction structure 61 and is electrically coupled to the first elongated doped region 62 and to the drain region 15. The first doped contact region 64 forms part of the drift region 26 of the transistor device 60. The first doped contact region 64 may extend substantially parallel to the first main surface 12 and may be positioned directly on the first elongated doped region 62 of the superjunction structure 61. The first doped contact region 64 may extend over the entire area at the bottom of trench 20 above the superjunction structure 61 and be in contact with both the first and second doped regions 62, 63. The superjunction structure 61 is positioned underneath the base 22 of the shallow trench 20 and the first doped contact region 64 may form the base 22 of the shallow trench 20. The transistor device 60 further includes a second doped contact region 65 which has the second conductivity type. The second doped contact region 65 is arranged on a second side of the superjunction structure 61, the second side opposing the first side. The second doped contact region 65 is electrically coupled to the second elongated doped regions 63 of the superjunction structure 61 and to a body contact 14 arranged at the main surface 12 over doped sinker region 66. The second doped contact region 65 may extend over the entire superjunction structure 61 and be in contact with both the first and second elongated doped region 62, 63.

As can be seen in the cross-sectional view of FIG. 5B, the second doped contact region 65 may extend within the semiconductor substrate 11 substantially parallel to the main surface 12 in a direction towards the body region 14. The second doped region 65 is electrically coupled to the body region 14 at the main surface 12, for example, by a conductive via 66, for example, a doped sinker structure.

The superjunction structure 61 typically comprises a plurality of first elongate doped regions 62 and second elongate doped regions 63 which are arranged alternately so as to form a plurality of PN junctions 68 each having a length which is substantially parallel to the main surface 12 and extends in a direction between the body region 16A and drain region 15. The pn junction is arranged substantially perpendicular to the first main surface 12.

In some embodiments, the superjunction structure 61 extends to the main surface 12 so as to form the gate side sidewall 23' of the shallow trench 20 which is positioned under the field plate 24. The opposing end of the elongate doped regions 62, 63 extends to the drain region 15. The gate dielectric 19 may be positioned on the portion of the superjunction structure 61 forming the side wall towards the gate electrode 17. The superjunction structure 61 can be considered to have an L-shape.

The first wall 23 of the shallow trench which is formed by the drain region 15 extends substantially perpendicularly to the main surface 12. The opposing sidewall 23' which may be formed by the first and second doped regions 62, 63 of the superjunction structure 61 may also extend substantially perpendicularly to the main surface or at an inclined angle to the main surface, whereby the inclined angle is between 45° and 89°.

In the cross-sectional view of FIG. 5B, metal contacts 69 to the source region 13 and body region 14, to the gate electrode and field plate 24 and to the drain region 15 are also illustrated.

In other non-illustrated embodiments, a field plate 24 that is separate from the gate electrode is provided as described with reference to FIG. 2. In these embodiments, the field plate 24 may be electrically coupled to the source region 13 or to a separate voltage supply or to the gate electrode. In other non-illustrated embodiments, the field plate 24 may have a field plate extension as described with reference to FIG. 4, whereby the field plate 24 may be integral with or separate from the gate electrode 17.

Figure 6:
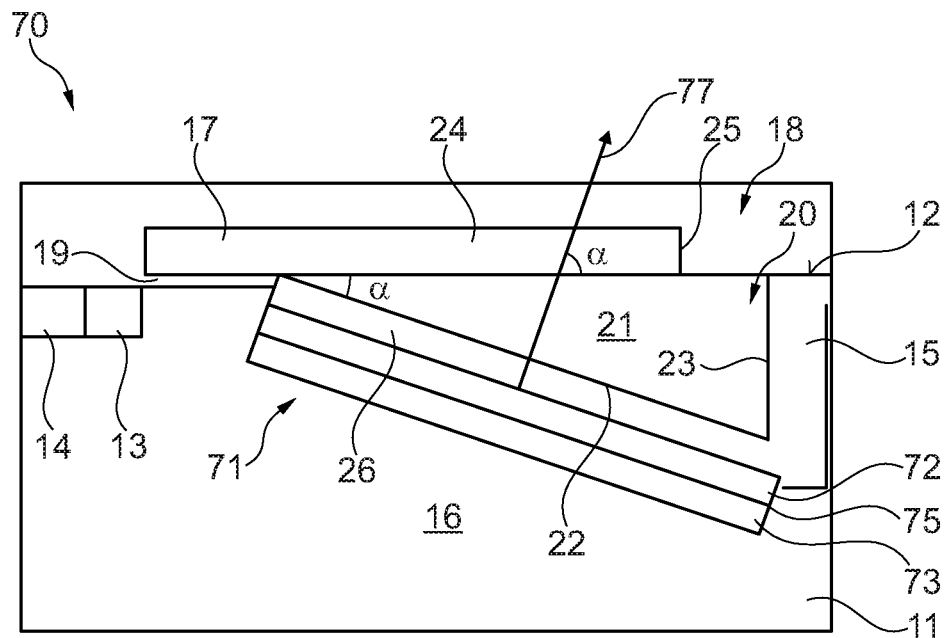
FIG. 6 illustrates a cross-sectional view of a transistor device according to an embodiment.

FIG. 6 illustrates a cross-sectional view of a lateral transistor device 70 which includes the combination of a wedge-shaped shallow trench 20 which has a triangular shape in cross-section, as in the embodiment illustrated in FIGS. 1 and 2, and a superjunction structure 71 as a field compensation structure. The superjunction structure 71 extends at an inclined angle to the main surface 12, whereby the inclined angle may be the same angle as the inclined angle α of the base 22 of the shallow trench 20 such that the superjunction structure 71 extends substantially parallel to the base 22 of the shallow trench 20. The superjunction structure 71 extends into the semiconductor body 11 at an increasing depth from the main surface 12 in a direction from the gate electrode 17 towards the drain region 15.

The superjunction structure 71 includes one first elongate doped region 72 of the first conductivity type and one second elongate doped region 73 of the second conductivity type. The first and second elongate doped regions 72, 73 are arranged in a stack having a stacking direction 77 which is arranged at the inclined angle α to the main surface 12. The pn junction 75 formed between the joining first and second elongate doped regions 72, 73 is also arranged at the inclined angle α to the main surface 12

FIG. 6 also illustrates the doped contact region 26 which forms the drift region of the transistor device 70 and which is electrically connected to the drain region 15. The doped contact region 26 forms the base of the shallow trench 20 and forms an interface with the first elongate doped region 72 of the first conductivity type. The doped contact region 26 electrically couples the first elongate doped region 72 of the superjunction structure 71 with the drain region 15.

In other non-illustrated embodiments, a field plate 24 that is separate from the gate electrode is provided as described with reference to FIG. 2. In these embodiments, the field plate 24 may be electrically coupled to the source region 13 or to a separate voltage supply or to the gate electrode. In other non-illustrated embodiments, the field plate 24 may have a field plate extension as described with reference to FIG. 4, whereby the field plate 24 may be integral with or separate from the gate electrode 17.

Figure 7:
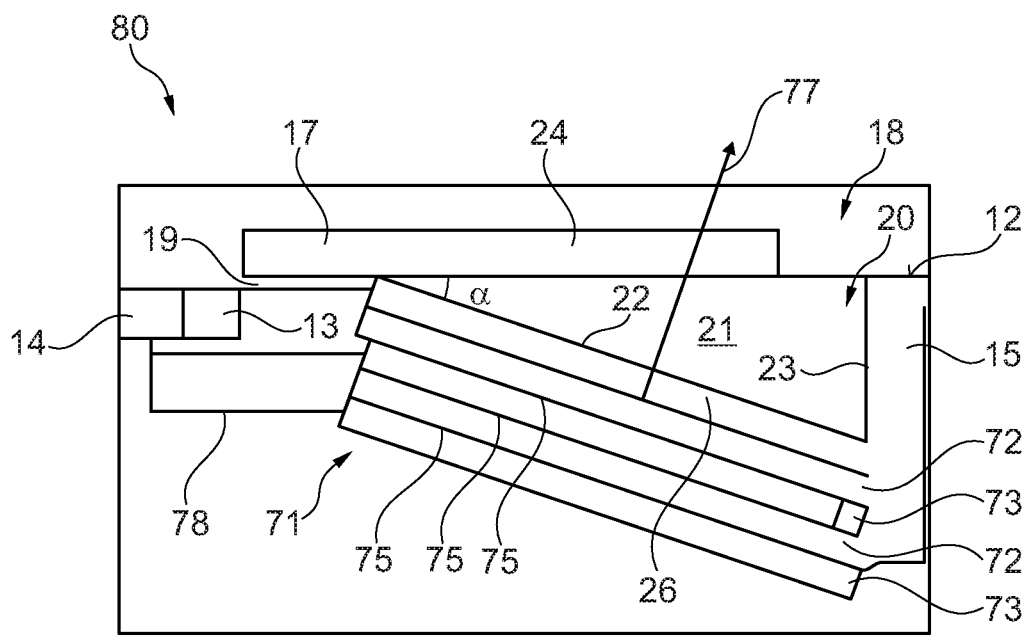
FIG. 7 illustrates a cross-sectional view of a transistor device according to an embodiment.

FIG. 7 illustrates a cross-sectional view of a lateral transistor device 80 including a wedge-shaped shallow trench 20 and superjunction structure 71 extending at an inclined angle α to the main surface 12 similar to the transistor device 70 illustrated in FIG. 6. In this embodiment, the superjunction structure 71 includes more than one PN junction and, therefore, includes a plurality of first doped elongate regions 72 and second doped elongate regions 73 and which have opposite conductivity types and which are arranged alternately in the stacking direction 77. A stack of pn junctions 75 is formed which each have a length which extends at an inclined angle α to the main surface 12 of the semiconductor body 11.

A first doped region 26 is also provided which forms the drift region of the transistor device 80 and the base 22 of the shallow trench and which extends on the entire area of the superjunction structure 71 and which forms an interface with the uppermost first doped region 72. The first doped regions 72 extend to the drain region 15 and are electrically coupled with the drain region 15. Also schematically illustrated in FIG. 7 is an electrical connection 78 to the second elongate doped regions 73 of the second conductivity type which is positioned in a plane in front of or behind the plane of the drawing. There is also an electrical connection of the drift layer 26 to all of the second elongate doped regions 73 on the source side, which is not illustrated in FIG. 7 but may be arranged in the third dimension perpendicular to the cross section.

In other non-illustrated embodiments, a field plate 24 that is separate from the gate electrode is provided as described with reference to FIG. 2. In these embodiments, the field plate 24 may be electrically coupled to the source region 13 or to a separate voltage supply or to the gate electrode. In other non-illustrated embodiments, the field plate 24 may have a field plate extension as described with reference to FIG. 4, whereby the field plate 24 may be integral with or separate from the gate electrode 17.

Figure 8A:
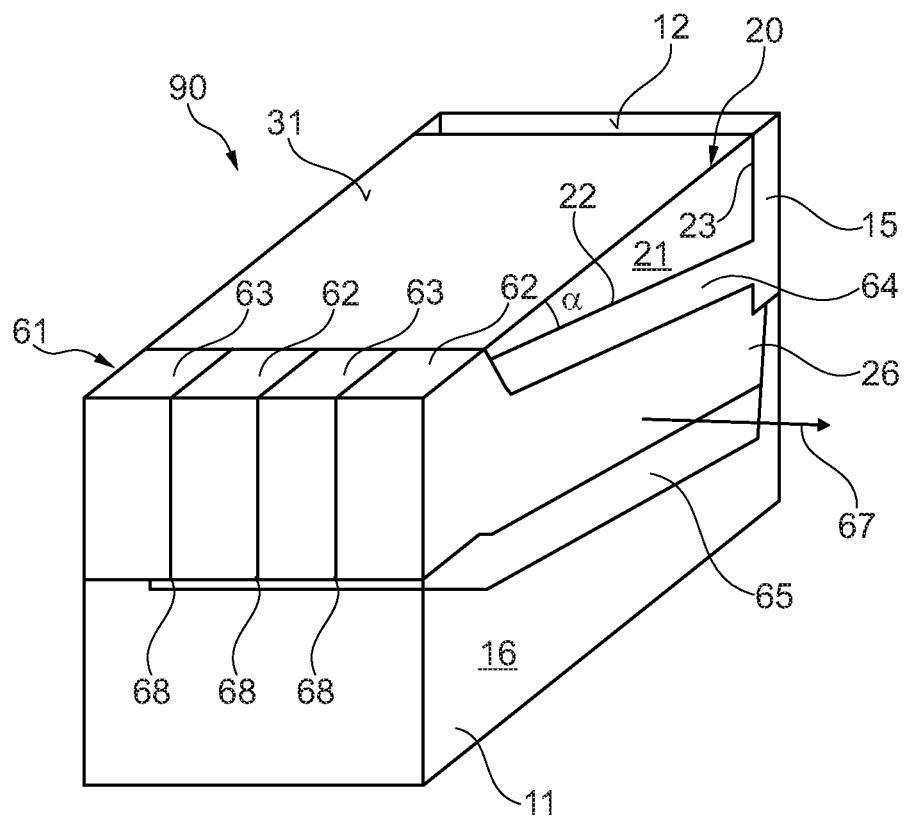
FIG. 8A illustrates a perspective view of a transistor device according to an embodiment.
Figure 8B:
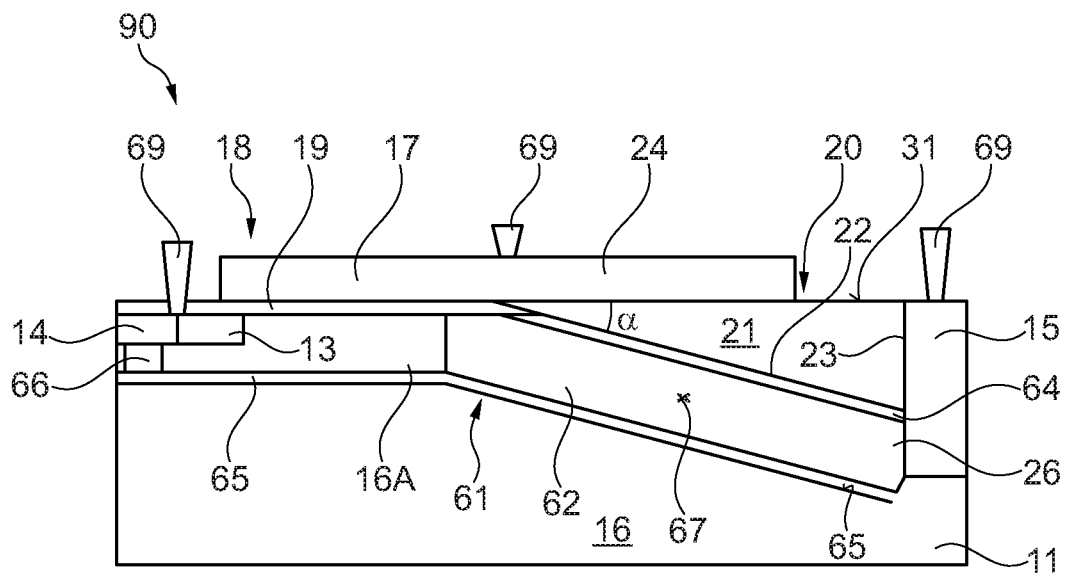
FIG. 8B illustrates a cross-sectional view of the transistor device of FIG. 8A.

FIG. 8A illustrates a perspective view and FIG. 8B a cross-sectional view of a transistor device 90 which includes a shallow trench 20 having a tapered wedge-shape with a triangular cross-section and a superjunction structure 61 having a form similar to that illustrated in FIG. 5. The inclined superjunction structure 61 has the form illustrated in FIG. 5 in which the stack of first and second elongate doped regions 62, 63 having a stacking direction 67 which extends parallel to the main surface 12. The superjunction structure 61 extends parallel to the base 22 of the wedge-shaped shallow trench 20 so that the length of first and second elongate doped regions 62, 63 and the pn junctions 65 extends at an inclined angle α to the main surface 12. The first elongate doped regions 62 and doped contact layer 64 provide the drift region 26 of the transistor device 90.

A first doped contact region 64 is provided between the base 22 of the shallow trench 20 and the upper surface of the superjunction structure 61. The first doped contact region 64 forms a part of drift region 26 of the transistor device and is electrically coupled to the drain region 15. A second doped contact region 65 is positioned on the opposing side of the superjunction structure 61 which extends under the superjunction structure 61 and further beside the body region 16A. The second doped contact region 65 has a low-ohmic electrical connection to the body region 14 formed by a conductive via 66 which may be provided by a doped conductive via.

The interfaces between the first and second elongate doped regions 62, 63 and the pn junctions extend substantially perpendicularly to the base 22 of the shallow trench 20. The superjunction structure 61 extends to the main surface 12 adjacent the tip 27 of the shallow trench 20 at a position that is below the gate dielectric 19.

In other non-illustrated embodiments, a field plate 24 that is separate from the gate electrode is provided as described with reference to FIG. 2. In these embodiments, the field plate 24 may be electrically coupled to the source region 13 or to a separate voltage supply or to the gate electrode. In other non-illustrated embodiments, the field plate 24 may have a field plate extension as described with reference to FIG. 4, whereby the field plate 24 may be integral with or separate from the gate electrode 17.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor device, comprising:
   a semiconductor body having a substantially planar main surface;
   a source region extending to the main surface and having a first conductivity type;
   a body region extending to the main surface and having a second conductivity type, the body region forming an interface with the source region;
   a drain region extending to the main surface and having the first conductivity type;
   a drift region having the first conductivity type and extending between the body region and the drain region;
   a gate electrode arranged on the main surface laterally between the source region and the drain region and electrically insulated from the semiconductor body by a gate insulation structure, the gate insulation structure comprising:
   a gate dielectric arranged on the main surface, and
   a shallow trench arranged in the drift region and filled with electrically insulating material, wherein the shallow trench has at least partly a wedge shape and the electrically insulating material has an upper surface that is substantially planar and extends substantially parallel to the main surface of the semiconductor body,
   wherein the shallow trench has a base that extends into the semiconductor body at an inclined angle to the main surface and in a direction from the gate dielectric to the drain region,
   wherein the drain region forms an interface with the electrically insulating material in the shallow trench and forms a side wall of the shallow trench,
   wherein the shallow trench has a triangular shape in cross-section,
   wherein the drift region is provided by a doped layer having the first conductivity type,
   wherein the doped layer forms the base of the shallow trench and is coupled to the drain region.

2. The transistor device of claim 1, wherein the inclined angle lies within the range of 0.8° to 8.8°.

3. The transistor device of claim 1, wherein the base extends into the semiconductor body at the inclined angle to the main surface in a first portion and extends substantially parallel to the main surface in a second portion.

4. The transistor device of claim 1, wherein the base of the shallow trench extends to the side wall and the side wall extends substantially perpendicularly to the main surface.

5. The transistor device of claim 1, further comprising a field plate that covers at least 50% of the length of the shallow trench at the main surface.

6. The transistor device of claim 5, further comprising:
   a field plate extension comprising one or more portions arranged between the field plate and the drain region that are spaced at a greater distance from the main surface than a distance between the field plate and the main surface.

7. The transistor device of claim 6, wherein the one or more portions of the field plate extension each have an end that faces the drain region and a line connecting the end of the field plate extension that forms an inclined angle to the main surface that is substantially the same as the inclined angle formed between the base of the shallow trench and the main surface.

8. The transistor device of claim 1, further comprising:
   a superjunction structure arranged under the shallow trench,
   wherein the superjunction structure comprises one or more first elongated doped regions of the first conductivity type and one or more second elongated doped regions of the second conductivity type and each having a length that extends substantially parallel to the base of the shallow trench.

9. The transistor device of claim 8, further comprising:
   a first doped contact region having the first conductivity type that is arranged on a first side of the superjunction structure, wherein the first doped contact region is coupled to the first doped regions of the superjunction structure and to the drain region; and
   a second doped contact region having the second conductivity type that is arranged on a second side of the superjunction structure opposing the first side, wherein the second doped contact region is coupled to the second doped regions and to a body contact at the main surface.

10. The transistor device of claim 9, wherein the first doped contact region forms the base of the shallow trench.

11. The transistor device of claim 9, wherein the superjunction structure extends to the main surface below the gate dielectric.

12. A transistor device, comprising:
    a semiconductor body having a main surface;
    a source region extending to the main surface and having a first conductivity type;
    a body region extending to the main surface having a second conductivity type, the body region forming an interface with the source region;
    a drain region extending to the main surface and having the first conductivity type;

a drift region having the first conductivity type and extending between the body region and the drain region;

a gate electrode arranged on the main surface laterally between the source region and the drain region and electrically insulated from the semiconductor body by a gate insulating structure comprising a gate dielectric arranged on the main surface and a shallow trench arranged in the drift region;

a superjunction structure arranged under the shallow trench, wherein the superjunction structure comprises at least one first elongated doped region of the first conductivity type and at least one second elongated doped region of the second conductivity type each having a length that extends parallel to the main surface;

a first doped contact region having the first conductivity type that is arranged on a first side of the superjunction structure, wherein the first doped contact region is coupled to the at least one first elongated doped region of the superjunction structure and to the drain region; and a second doped contact region having the second conductivity type that is arranged on a second side of the superjunction structure opposing the first side, wherein the second doped contact region is coupled to the at least one second elongated doped region of the superjunction structure and to a body contact at the main surface.

13. The transistor device of claim 12, wherein the first doped contact region provides the drift region and forms a base of the shallow trench.

14. The transistor device of claim 12, wherein the shallow trench comprises a first side wall formed by the drain region.

15. The transistor device of claim 14, wherein the superjunction structure extends to the main surface below the gate dielectric and forms a second side wall of the shallow trench that opposes the first side wall.

16. The transistor device of claim 15, wherein the superjunction structure extends to the main surface at an inclined angle to the main surface, and wherein the inclined angle is between 1° and 89°.

17. The transistor device of claim 14, wherein the first side wall of the shallow trench extends substantially perpendicularly to the main surface.

18. The transistor device of claim 17, wherein the superjunction structure extends to the main surface at an inclined angle to the main surface, and wherein the inclined angle is between 1° and 89°.

19. The transistor device of claim 1, wherein the doped layer extends from the main surface at the inclined angle from a position under the gate electrode in a direction of the drain region and overlaps the drain region.

20. The transistor device of claim 1, wherein a gate sided end of the doped layer forms a portion of the main surface of the semiconductor body and is in contact with the gate dielectric.

21. A transistor device, comprising:

a semiconductor body having a substantially planar main surface;

a source region extending to the main surface and having a first conductivity type;

a body region extending to the main surface and having a second conductivity type, the body region forming an interface with the source region;

a drain region extending to the main surface and having the first conductivity type;

a drift region having the first conductivity type and extending between the body region and the drain region;

a gate electrode arranged on the main surface laterally between the source region and the drain region and electrically insulated from the semiconductor body by a gate insulation structure, the gate insulation structure comprising:

a gate dielectric arranged on the main surface, and a shallow trench arranged in the drift region and filled with electrically insulating material, wherein the shallow trench has at least partly a wedge shape and the electrically insulating material has an upper surface that is substantially planar and extends substantially parallel to the main surface of the semiconductor body;

a field plate that covers at least 50% of the length of the shallow trench at the main surface; and a field plate extension comprising one or more portions arranged between the field plate and the drain region that are spaced at a greater distance from the main surface than a distance between the field plate and the main surface.

22. The transistor device of claim 21, wherein the one or more portions of the field plate extension each have an end that faces the drain region and that forms an inclined angle to the main surface that is substantially the same as the inclined angle formed between a base of the shallow trench and the main surface.

\* \* \* \* \*